(12) United States Patent
Hautala et al.

(10) Patent No.: US 12,183,627 B2
(45) Date of Patent: Dec. 31, 2024

(54) MULTI PROCESS AIR GAP FORMATION

(71) Applicant: Applied Materials, Inc., Santa Clara, CA (US)

(72) Inventors: John Hautala, Beverly, MA (US); Charith Nanayakkara, Gloucester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 407 days.

(21) Appl. No.: 17/569,142

(22) Filed: Jan. 5, 2022

(65) Prior Publication Data

US 2023/0087442 A1 Mar. 23, 2023

Related U.S. Application Data

(60) Provisional application No. 63/247,512, filed on Sep. 23, 2021.

(51) Int. Cl.
*H01L 21/02* (2006.01)
*H01L 21/768* (2006.01)

(52) U.S. Cl.
CPC .... *H01L 21/7682* (2013.01); *H01L 21/02164* (2013.01); *H01L 21/02266* (2013.01); *H01L 21/02274* (2013.01)

(58) Field of Classification Search
CPC ............... H01L 21/7682; H01L 21/768; H01L 21/02164; H01L 21/02; H01L 21/02266; H01L 21/02274; H01L 21/02203; H01L 21/76825; H01L 21/76834; H01L 23/5222; H01L 23/522; H01L 23/5283; H01L 21/76826; H01L 23/642
See application file for complete search history.

(56) References Cited

U.S. PATENT DOCUMENTS

| 7,045,849 | B2 * | 5/2006 | Chen | H10B 69/00 257/317 |
|---|---|---|---|---|
| 8,514,398 | B2 * | 8/2013 | Pang | G03H 1/02 422/82.11 |
| 2004/0232496 | A1 * | 11/2004 | Chen | H10B 41/30 257/E27.103 |
| 2012/0105853 | A1 * | 5/2012 | Pang | G03H 1/02 356/445 |
| 2021/0033977 | A1 * | 2/2021 | Raaijmakers | G03F 7/265 |

OTHER PUBLICATIONS

Kempshall et al., "Comparative evaluation of protective coating and focuses ion beam chemical vapor deposition processes", 2002, J. Vac. Sci. Technol. B 20(1) pp. 286-290, Jan. 2002. (Year: 2002).*

* cited by examiner

*Primary Examiner* — Nikolay K Yushin
(74) *Attorney, Agent, or Firm* — KDW FIRM PLLC (57) ABSTRACT

A method may include providing an array of patterned features on a substrate, the array of patterned features characterized by a spacing. The method may include directing a sputtering species in a first exposure to the array of patterned features, wherein an upper portion of a patterned feature of the array of patterned features forms a protrusion, extending towards an adjacent patterned feature, of the array of patterned features. The method may also include directing a depositing species in a second exposure to the array of patterned features, wherein an array of voids is formed between adjacent patterned features.

16 Claims, 11 Drawing Sheets

MULTI PROCESS AIR GAP FORMATION

RELATED APPLICATIONS

This application claims priority to U.S. provisional patent application Ser. No. 63/247,512, filed Sep. 23, 2021, entitled "MULTI PROCESS AIR GAP FORMATION," and incorporated by reference herein in its entirety.

FIELD OF THE DISCLOSURE

Embodiments of the present disclosure relate generally to the field of semiconductor device fabrication, and more particularly to devices incorporating low dielectric constant regions.

BACKGROUND OF THE DISCLOSURE

In order to improve signal propagation in devices, such as semiconductor devices, conductive structures including metal lines or vias, may be separated by regions having a low dielectric constant (relative dielectric permittivity). Much effort has been expended to lower the effective dielectric constant of materials to be incorporated in these separation regions, including the use of so-called air gaps, where voids may be formed. The dielectric constant in the separation region accordingly depends upon the fraction of the separation region occupied by the void. In known approaches, void formation may be induced at least in part by a chemical vapor deposition (CVD) process, where a portion of the separation region is filled by a deposited layer, before eventual void formation between adjacent conductors, resulting in the so-called air gap structure. Among the challenges in air gap formation are the ability to control the air gap volume, the height of the air gap, as well as the reproducibility or variation in such parameters.

With respect to these and other considerations, the present improvements may be useful.

BRIEF SUMMARY

In one embodiment, a method may include providing an array of patterned features on a substrate, and directing a sputtering species in a first exposure to the array of patterned features, wherein an upper portion of a patterned feature of the array of patterned features forms a protrusion, extending towards an adjacent patterned feature, of the array of patterned features. The method may further include directing a depositing species in a second exposure to the array of patterned features, wherein an array of voids is formed between adjacent patterned features.

In another embodiment, a method is provided, including providing an array of patterned features on a substrate, wherein the array of patterned features includes a conductive portion, and an outer layer, comprising an insulator material, disposed over an outer surface of the conductive portion. The method may include directing a sputtering species in a first exposure to the array of patterned features, wherein an upper portion of the outer layer forms a protrusion, extending towards an adjacent patterned feature, of the array of patterned features. The method may also include directing a depositing species in a second exposure to the array of patterned features, wherein an array of voids is formed between adjacent patterned features.

In a further embodiment, a method of forming an airgap device structure is provided. The method may include providing an array of patterned features on a substrate, the array of patterned features, comprising a conductive portion, and an outer layer, comprising an insulator material, disposed over an outer surface of the conductive portion. The method may include directing a sputtering species in a first exposure to the array of patterned features, wherein an upper portion of the outer layer forms a protrusion, extending towards an adjacent patterned feature, of the array of patterned features, and wherein the sputtering species do not strike a bottom surface of the array of patterned features. The method may also include directing a depositing species in a second exposure to the array of patterned features, the second exposure comprising a directional plasma enhanced chemical vapor deposition process, wherein an array of voids is formed between adjacent patterned features.

BRIEF DESCRIPTION OF THE DRAWINGS

By way of example, various embodiments of the disclosed techniques will now be described, with reference to the accompanying drawings, wherein.

DETAILED DESCRIPTION

The present embodiments will now be described more fully hereinafter with reference to the accompanying drawings, wherein some embodiments are shown. The subject matter of the present disclosure may be embodied in many different forms and is not to be construed as limited to the embodiments set forth herein. These embodiments are provided so this disclosure will be thorough and complete, and will convey certain exemplary aspects of the subject matter to those skilled in the art. In the drawings, like numbers refer to like elements throughout.

Figures 1A, 1B:
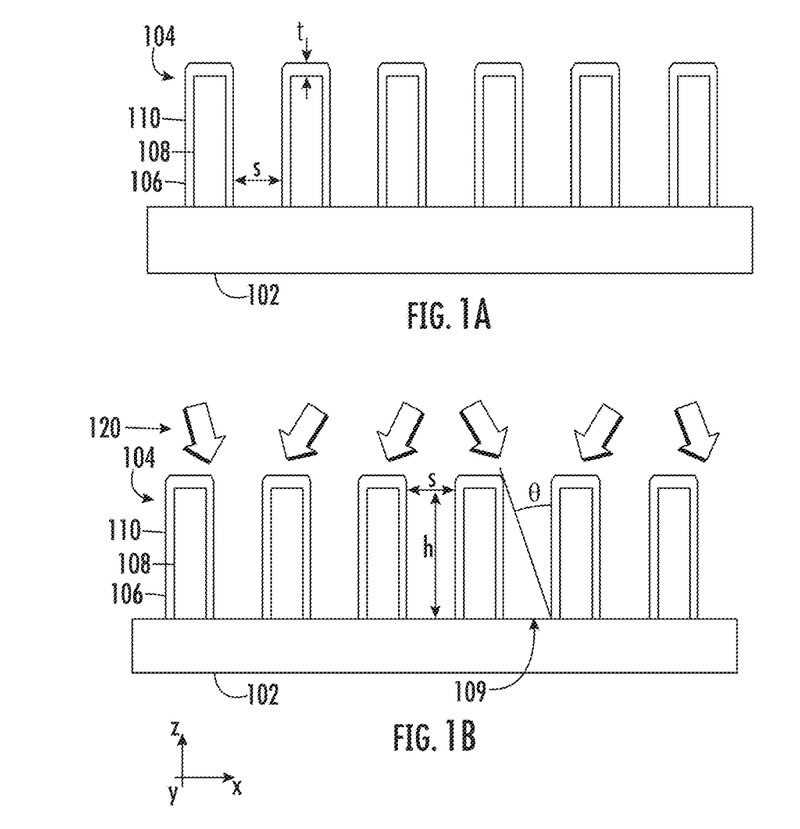
FIG. 1A is a schematic cross-sectional view illustrating a substrate having patterned features at a first instance.
FIG. 1B is a schematic cross-sectional view illustrating the substrate of FIG. 1A at another instance, during processing using sputtering ions, in accordance with embodiments of the disclosure.

Turning now to the figures, there is shown a novel approach to forming low dielectric constant regions in devices based upon so-called air gap structures. In particular, the approach outlined in the present embodiments may harness the shaping of patterned features in order to better control the location, size, and variability of air gaps or voids within a device structure. FIG. 1A is a schematic cross-sectional view illustrating a substrate having patterned features at a first instance. The structure of FIG. 1A includes a substrate 102, which substrate may represent any combination of layers, device structures, and materials. The structure of FIG. 1A includes an array 104 of patterned features 106, where the patterned features are separated from one another. According to some embodiments, the patterned features 106 may represent conductive structures, such as metal wiring or other metal features. Such features may be present in semiconductor devices where metallic elements are frequently used, including back end of line for integrated circuits, including so-called metal levels, M1, M2, etc. One goal of processing such structures is to provide a low dielectric constant medium between metallic features. The FIGS. 1B-1J to follow detail an approach that may be suitable for that goal, in accordance with embodiments of the disclosure As further shown in FIG. 1A, a patterned feature 106 includes a conductive portion 108 and an outer layer 110, comprising an insulator material. The conductive portion 108 may represent a metal structure for wiring in one example, or semiconductor fins in a finFET or similar device structure, according to other examples. The outer layer 110 is disposed over an outer surface of the conductive portion 108, so as to surround the conductive portion 108. The outer layer 110 may have an initial thickness, shown as T, which thickness is designed to at least partially protect the conductive portion 108 during subsequent processing.

FIG. 1B is a schematic cross-sectional view illustrating the substrate of FIG. 1A at another instance. In FIG. 1B, a sputtering operation is depicted, where sputtering species 120 are directed to the substrate 102. The sputtering species 120 may directed at a suitable angle of incidence with respect to a normal to a main plane of the substrate 102, meaning the X-Y plane. In various embodiments the sputtering species 120 are directed at an angle of incidence of 0 degrees to 45 degrees with respect to a normal to a main surface of the substrate 102. In some embodiments, a suitable angle may be greater than 10 degrees with respect to the normal, such as 20 degrees with respect to the normal, as detailed in some examples to follow. One consideration for determining a suitable angle for sputtering species 120 is that the suitable angle is that angle or greater where the sputtering species 120 are shadowed from striking the bottom surface 109 of the array 104. This angle will thus be determined by the relative ratio of the spacing s and height h of the patterned features 106. The sputtering species may be any suitable ion, such as an inert gas ion (e.g., argon, krypton, etc.), nitrogen, oxygen, and so forth, while the ion energy may vary between approximately 50 eV and 10 keV in various non-limiting embodiments.

Figure 1C:
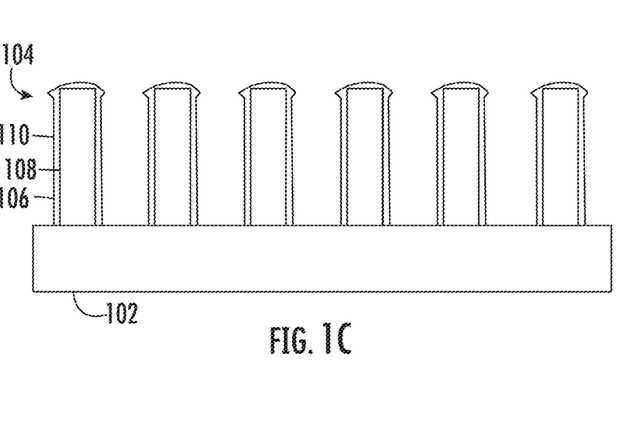
FIG. 1C is a schematic cross-sectional view illustrating the substrate at another instance, after the operation of FIG. 1B.
Figure 1D:
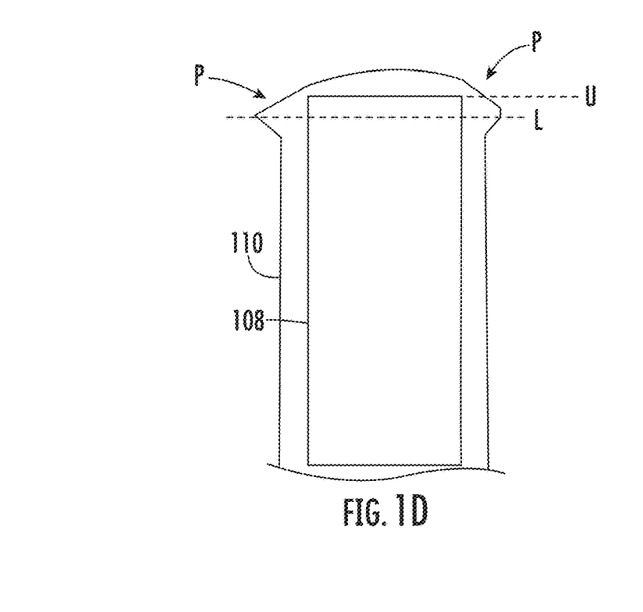
FIG. 1D is a schematic cross-sectional view illustrating a close-up view of the substrate at the instance of FIG. 1C.

FIG. 1C is a schematic cross-sectional view illustrating the substrate at another instance, after the operation of FIG. 1B. FIG. 1D is a schematic cross-sectional view illustrating a close-up view of the substrate at the instance of FIG. 1C. As shown, an upper portion of the patterned feature 106 forms a bump or protrusion P, extending towards an adjacent patterned feature, of the array 104 of patterned features 106. The protrusion may represent the redistribution of material of outer layer 110, caused by the sputtering species 120. As shown particularly in FIG. 1D, the level of the protrusion P lies below the level of the upper surface U of the array 104 of patterned features 106. Advantages of this shaping of the patterned features 106 are detailed in the discussion to follow.

Note that according to some embodiments, the operation of FIG. 1B may be designed to remove a targeted thickness of the outer layer 110, where the targeted thickness that is removed is less than the initial thickness, as represented by T. In this manner, the conductive portion 108 remains protected by at least some part of the outer layer 110, as illustrated in FIG. 1D, thus preventing any redistribution of conductive material during sputtering of outer layer 110, and accordingly preventing any unwanted effects that may result from the redistribution of such conductive material.

Figure 1E:
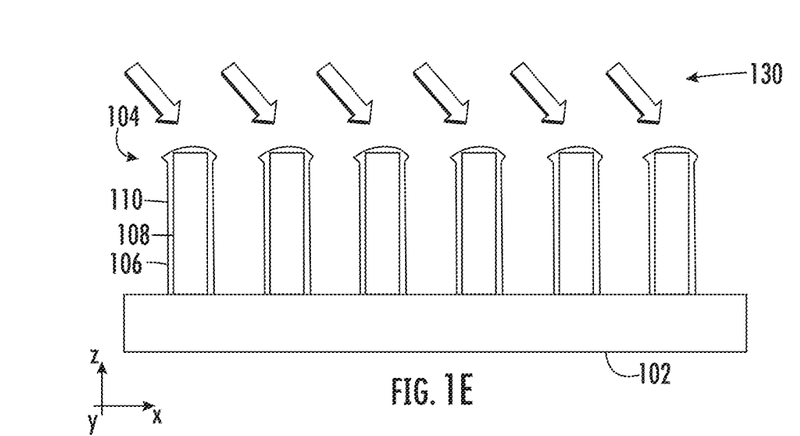
FIG. 1E and FIG. 1F depict a schematic cross-sectional view illustrating the substrate of FIG. 1C during processing by depositing species, subsequent to the instance of FIG. 1C, in accordance with embodiments of the disclosure.
Figure 1F:
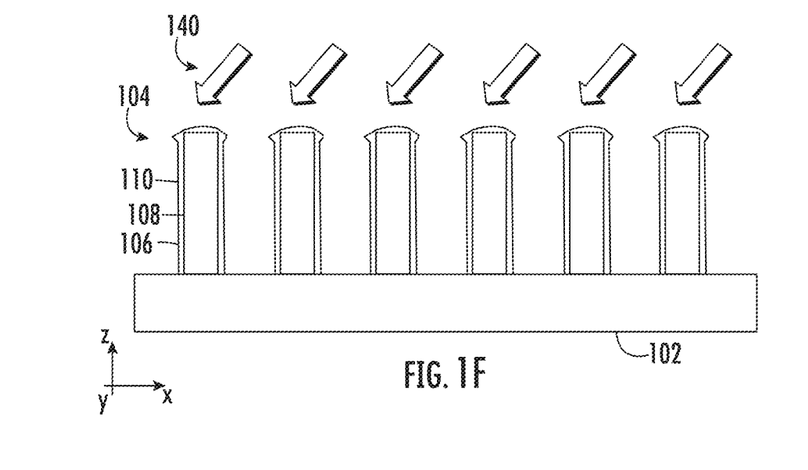

FIG. 1E and FIG. 1F depict a schematic cross-sectional view illustrating the substrate of FIG. 1C during processing by depositing species 130 (and depositing species 140) subsequent to the instance of FIG. 1C, in accordance with embodiments of the disclosure. The operations of FIG. 1E and FIG. 1F may occur sequentially to one another, or may take place simultaneously, and may thus constitute different aspects of the same exposure. The depositing species 130 may impinge upon the substrate 102 at a suitable angle of incidence, such as 0 degrees to 45 degrees with respect to a normal to the main plane of the substrate 102 (X-Y plane) in some non-limiting embodiments. The depositing species 130 may be generated in a suitable process, such as a known CVD process, where the angle of incidence of depositing species may not be precisely controlled, but may vary about 0 degrees incidence in some cases. The depositing species 130 may alternatively be generated in special apparatus, designed to generate a collimated beam of depositing species and to control the angle of incidence to not lie along the normal (Z-axis). The significance of this control is detailed below.

As suggested in FIG. 1E and FIG. 1F, the depositing species 130 and depositing species 140 may be directed at opposite angles (with respect to the Z-X plane). As such, the depositing species 130 and the depositing species 140 may impinge upon different surfaces of the patterned features 106. A result of this process is the accumulation of depositing material above the patterning features 106 and between the patterning features 106, in a manner that generates a buried void, between adjacent patterned features. The resultant structure is detailed with respect to FIGS. 1G-1J.

Figure 1G:
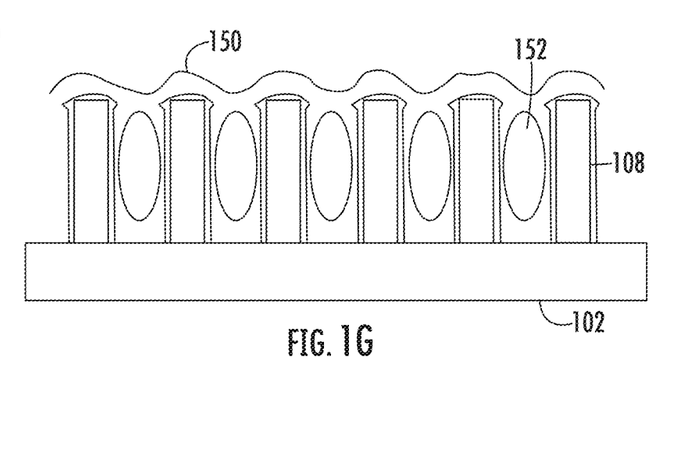
FIG. 1G is a schematic cross-sectional view illustrating the substrate at another instance, after the processing operations of FIG. 1E and FIG. 1F.
Figure 1H:
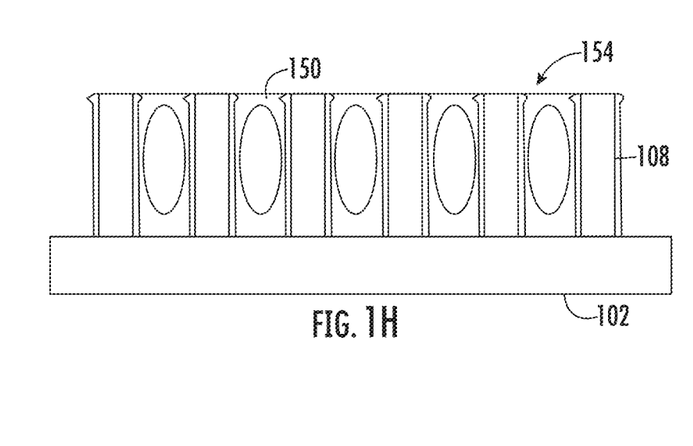
FIG. 1H is a schematic cross-sectional view illustrating the substrate at another instance, after further processing of the substrate of FIG. 1G.
Figure 1I:
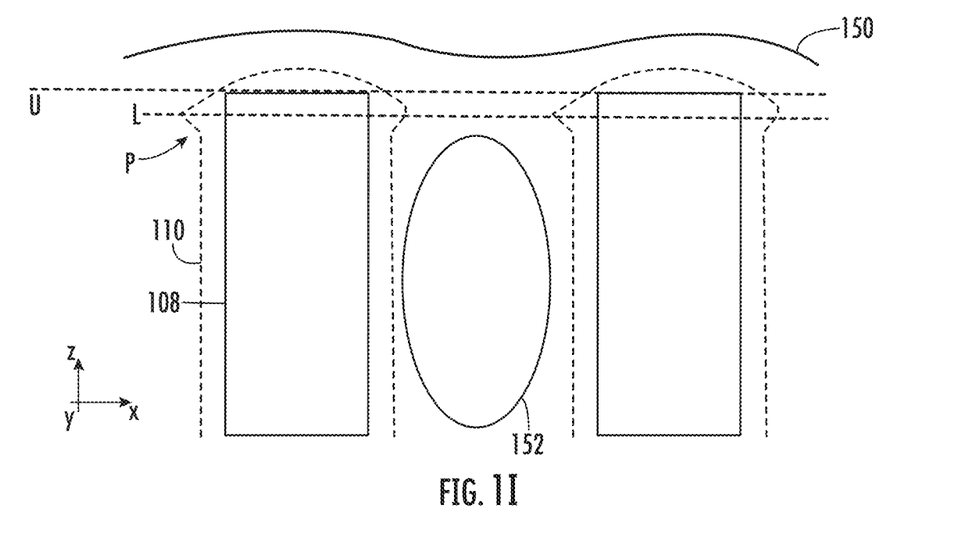
FIG. 1I is a schematic cross-sectional view illustrating a close-up view of the substrate at the instance of FIG. 1G.
Figure 1J:
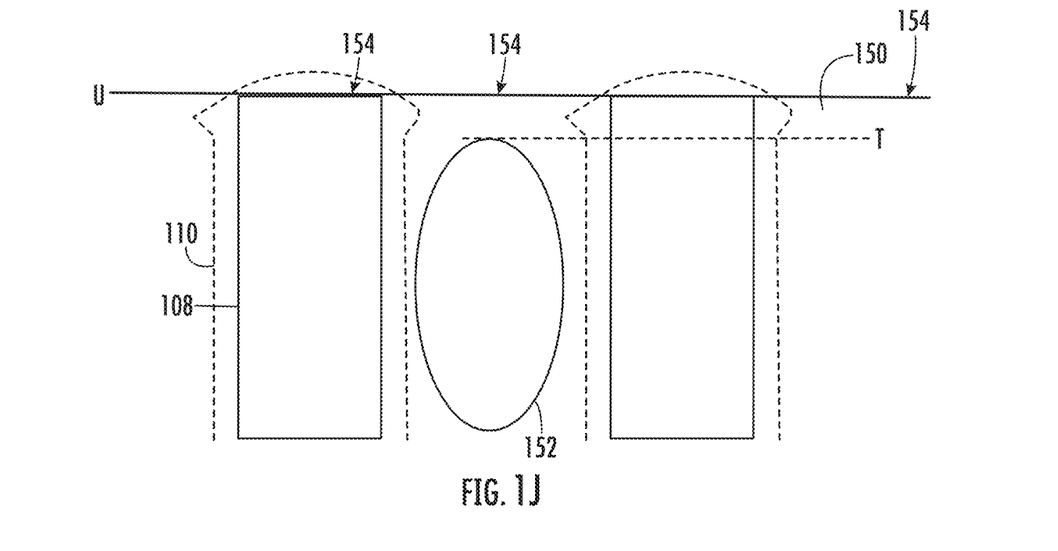
FIG. 1J is a schematic cross-sectional view illustrating a close-up view of the substrate at the instance of FIG. 1H.
Figures 1K, 1L:
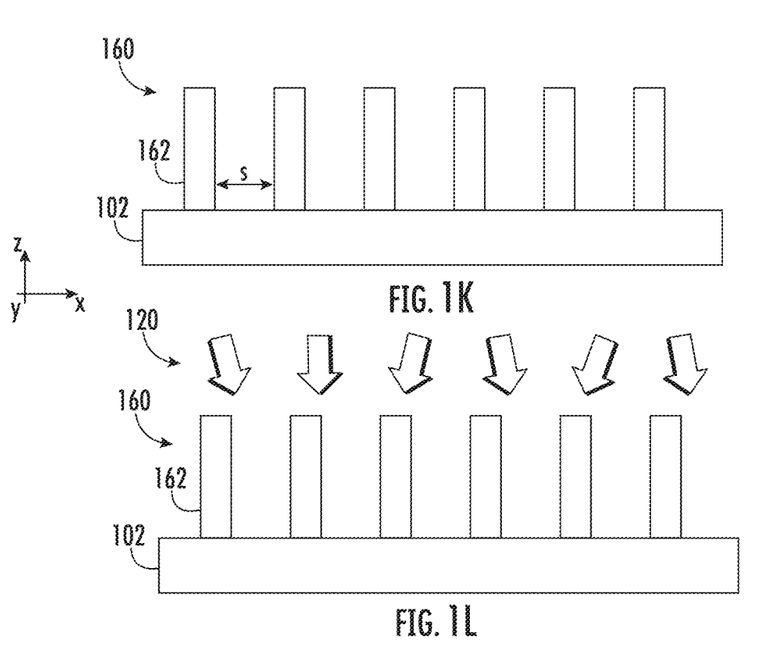
FIG. 1K is a schematic cross-sectional view illustrating a substrate having another set of patterned features at a first instance.
FIG. 1L is a schematic cross-sectional view illustrating the substrate of FIG. 1K at another instance, during processing using sputtering ions, in accordance with embodiments of the disclosure.

In particular, FIG. 1G is a schematic cross-sectional view illustrating the substrate at another instance, after the processing operations of FIG. 1E and FIG. 1F. FIG. 1H is a schematic cross-sectional view illustrating the substrate at another instance, after further processing of the substrate of FIG. 1G. FIG. 1I is a schematic cross-sectional view illustrating a close-up view of the substrate at the instance of FIG. 1G, while FIG. 1J is a schematic cross-sectional view illustrating a close-up view of the substrate at the instance of FIG. 1H. As shown in FIG. 1G, a low dielectric constant layer 150 has been formed above and between the patterned features 106. For example, the low dielectric constant layer 150 may be formed of a suitable insulator material such as an SiO-based material, such as $SiO_2$. A hallmark of the low dielectric constant layer 150 is the placement of voids 152 between adjacent members of the array 104 of patterned features 106.

After the formation of the low dielectric constant layer 150, a subsequent operation, to planarize the structure of FIG. 1G, may produce the structure of FIG. 1H, where insulator material is removed from above the patterned features 106, so that the surface 154 of the planarized structure coincides with the upper surface U of the patterned features 106.

With reference to FIG. 1I and FIG. 1J in particular, the upper surface U may be disposed above the level L of the distal points of the protrusion P. In addition, the level of the top T of voids 152, meaning an uppermost point of voids 152, is below the upper surface U. Thus, the uppermost point of the voids 152 are buried below the upper surface of insulator material in the remaining parts of low dielectric constant layer 150.

While the embodiments of FIGS. 1A-1J illustrate an approach to buried void formation in an array of conductive features that are coated with an insulator, embodiments of the disclosure may be applied to the formation of buried voids in arrays of patterned features, where the patterned features constitute a single material, such as patterned insulator structures, patterned semiconductor structures, or patterned metal structures. Moreover, the patterned features may constitute multiple portions where the different portions are not conductive, or where an inner portion is not conductive and an outer portion is conductive. The embodiments are not limited in this context.

Figure 1M:
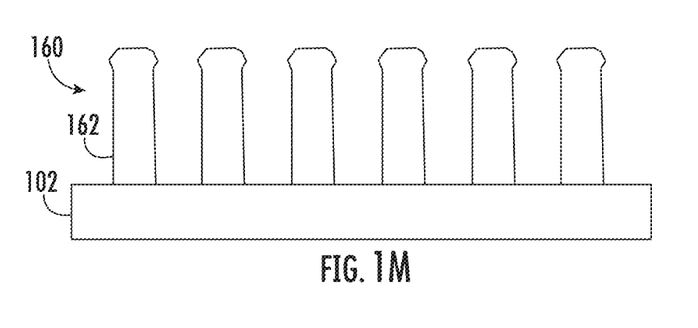
FIG. 1M is a schematic cross-sectional view illustrating the substrate at another instance, after the operation of FIG. 1L.
Figure 1N:
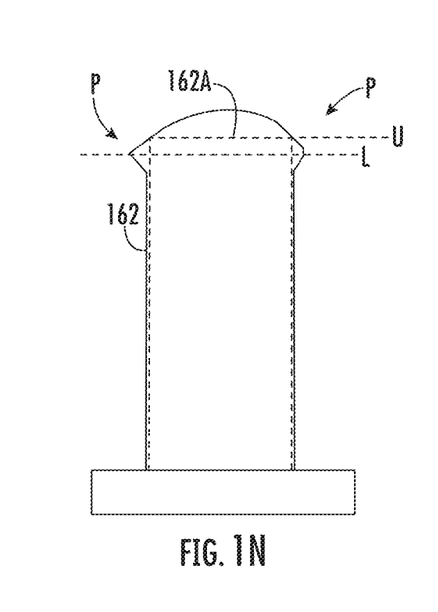
FIG. 1N is a schematic cross-sectional view illustrating a close-up view of the substrate at the instance of FIG. 1M.
Figure 1O:
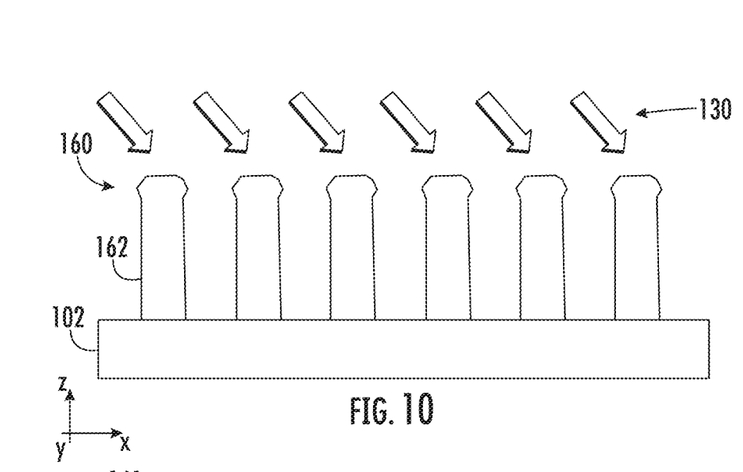
FIG. 1O and FIG. 1P depict a schematic cross-sectional view illustrating the substrate of FIG. 1M during processing by depositing species, subsequent to the instance of FIG. 1M, in accordance with embodiments of the disclosure.
Figure 1P:
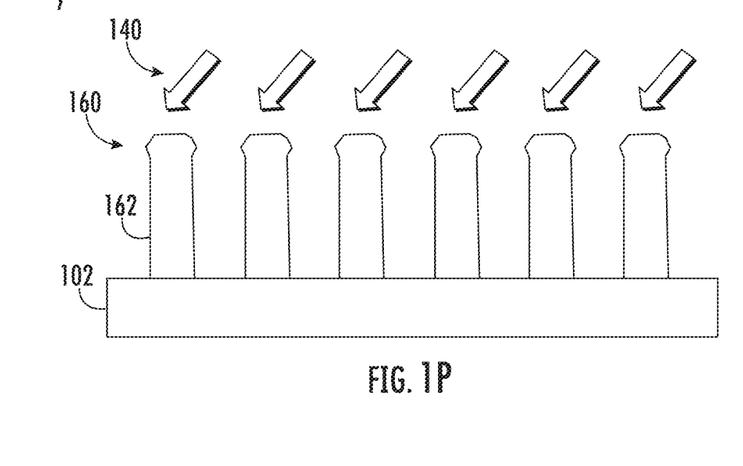
Figure 1Q:
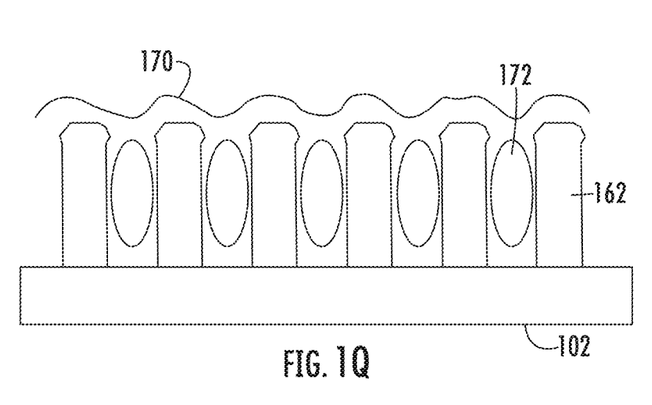
FIG. 1Q is a schematic cross-sectional view illustrating the substrate at another instance, after the processing operations of FIG. 1O and FIG. 1P.
Figure 1R:
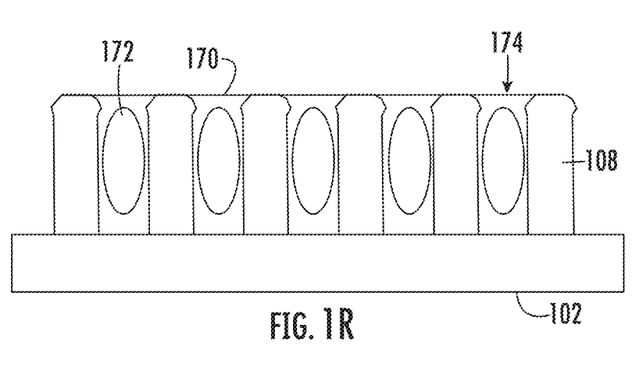
FIG. 1R is a schematic cross-sectional view illustrating the substrate at another instance, after further processing of the substrate of FIG. 1Q.

To illustrate other embodiments, FIG. 1K-1R present a series of operations that mirror the corresponding operations of FIG. 1A-1H. In this example, a unitary, single-material structure is used for the array 160 of patterned features 162. After being subject to sputtering species 120, as described above, the patterned features assume protrusions P, as shown in FIG. 1M and FIG. 1N. After being subject to depositing species 130 and depositing species 140, described above, a low dielectric constant layer 170 forms. By virtue of the presence of the protrusions P, the voids 172 are located below the planarized surface 174, similar to the configuration of FIG. 1J, discussed above.

As further detailed in the embodiments to follow, control of placement of voids or airgaps among conductive features is useful in device structures that are to be planarized to the top of the conductive structures.

According to various embodiments of the disclosure, the sputtering species for performing the aforementioned first exposure may be provided by any suitable apparatus, including beamline ion implanters, plasma deposition tools, compact ribbon beam-type apparatus, or other apparatus employing an ion beam source or a plasma source. Such apparatus may be driven by an inductively coupled source, a capacitively coupled plasma, where ion energy is set by RF bias or DC bias of substrate with respect to the plasma. Control of angle of incidence of the sputtering species may be achieved, for example, by tilting of a substrate with respect to an ion beam, or alternatively, by extracting an ion beam at a controlled angle of incidence with respect to a normal to the main substrate plane.

Figure 2A:
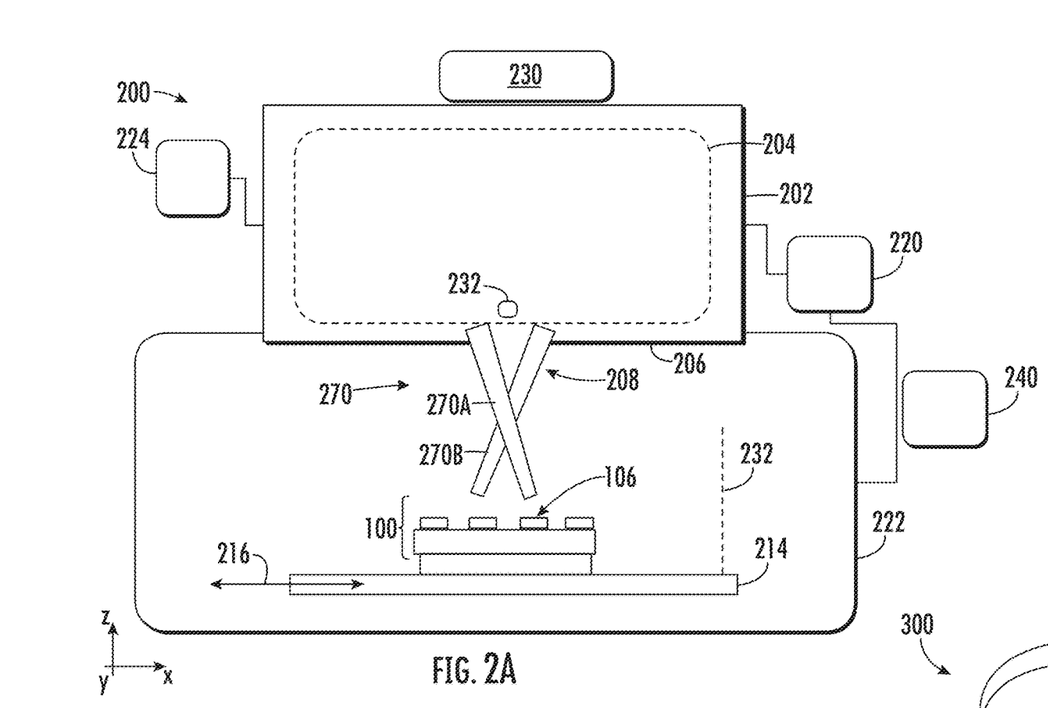
FIG. 2A illustrate a side view of a processing apparatus in accordance with some embodiments.

FIG. 2A depicts a side view of a processing apparatus 200 during ion beam processing of a substrate, in accordance with embodiments of the present disclosure. The processing apparatus 200 may be suitable for performing a sputtering operation, as detailed above, or alternatively, or in addition, a deposition operation, such as direction chemical vapor deposition, as discussed above. The processing apparatus 200 may be a plasma-based processing system having a plasma chamber 202 for generating a plasma 204 therein by any convenient method as known in the art. A power supply 230, may, for example, be an RF power supply to generate the plasma 204. An extraction plate 206 may be provided as shown, having an extraction aperture 208, where a selective etching may be performed to selectively remove sidewall layers. A substrate, such as a substrate 100 having the aforementioned structure as shown at FIGS. 1A, is disposed in the process chamber 222. A substrate plane of the substrate 100 is represented by the X-Y plane of the Cartesian coordinate system shown, while a perpendicular to the plane of the substrate 100 lies along the Z-axis (Z-direction).

As further shown in FIG. 2A, a controller 240 may be provided to send control signals to the bias supply 220 and to the substrate stage 214. In one example, the view of FIG. 2A may represent a variant of the sputtering operations shown in FIG. 1B, for example. During a sputtering operation, a plasma, such as a reactive plasma is formed using a reactive chemistry in the plasma chamber 202, and an ion beam 270 is extracted from the plasma chamber 202. The ion beam may be extracted as a single ion beam, generally represented as ion beam 270, or as a pair of ion beams, as shown for ion beam 270A and ion beam 270B. The angle of the ion beam or ion beams may be along a normal to a main plane of the substrate 100, meaning forming a zero degree inclination with respect to the perpendicular (Z-axis) to the X-Y plane, or may from a non-zero angle with respect to the Z axis. Notably, the processing apparatus 200 as depicted includes a beam blocker 232, disposed adjacent the extraction aperture 208. The beam blocker 232 is sized and positioned to define a first aperture 208A and a second aperture 208B, where the first aperture 208A forms a first angled ion beam 270A, and the second aperture 208B forms a second angled ion beam 270B. The two angled ion beams may define angles of incidence with respect to the perpendicular 232, equal in magnitude, opposite in direction. In one embodiment, the first angled ion beam 270A and the second angled ion beam 270B may represent an angled reactive ion beam. The beam blocker offset along the Z-axis with respect to extraction plate 206 may help define the angle of the angled ion beams. As a pair of ion beams, defining two equal, but opposite angles of incidence, tailoring of the shape of surface features will proceed according to the magnitude of the non-zero angle of incidence of sputtering ions of the ion beam 270, discussed in more detail below. In embodiments where a single ion beam is used, the sputtering effect of two oppositely-angled ion beams may be achieved by providing two separate exposures to the single ion beam, with a 180 degree substrate rotation around the Z-axis performed between the separate exposures.

Figure 2B:
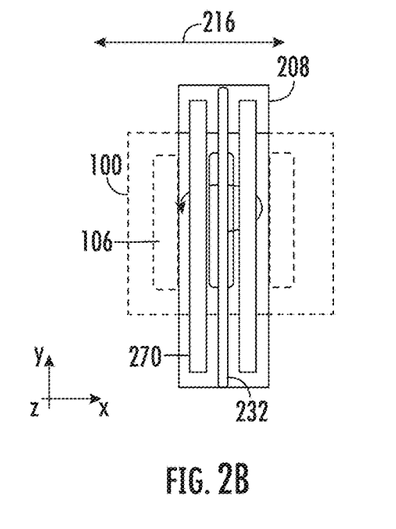
FIG. 2B illustrate a top plan view of the processing apparatus in accordance with some embodiments.

In the example of FIG. 2B, the angled ion beam 270 is provided as a pair of ribbon ion beams that are formed by an elongated extraction aperture, extending to a beam width along the X-direction, where the beam width is adequate to expose an entire width of the substrate 100, even at the widest part along the X-direction. Exemplary beam widths may be in the range of 10 cm, 20 cm, 30 cm, or more while exemplary beam lengths along the Y-direction may be in the range of 3 mm, 5 mm, 10 mm, or 20 mm. The embodiments are not limited in this context.

The angled ion beams 270 may be extracted when a voltage difference is applied using a bias voltage source, shown as bias supply 220, between the plasma chamber 202 and substrate 100 as in known systems. The bias supply 220 may be coupled to the process chamber 222, for example, where the process chamber 222 and substrate 100 are held at the same potential. In various embodiments, the angled ion beam 270 may be extracted as a continuous beam or as a pulsed ion beam as in known systems. For example, the bias supply 220 may be configured to supply a voltage difference between plasma chamber 202 and process chamber 222, as a pulsed DC voltage, where the voltage, pulse frequency, and duty cycle of the pulsed voltage may be independently adjusted from one another. When configured in the shape of a ribbon beam as in FIG. 2B, these angled ion beams may expose an entirety of the substrate 100 to sputter etch the top portions of the patterned features 106 distributed in devices across the substrate 100, by scanning the substrate stage 214 along the scan direction 216, as shown. In various embodiments, for the purpose of the sputtering operations outlined above, the value of the "non-zero" angle of incidence may vary from 0 degrees to 85 degrees, while in some embodiments the value may range between 0 degrees and 45 degrees. The embodiments are not limited in this context. For the purposes of sputtering, the angled ion beam 270 may be composed of any convenient gas mixture, including inert gas, reactive gas, and may be provided at a suitable ion energy to achieve a targeted level of sputtering. Non-limiting ranges of ion energy may be between 50 eV and 10 keV.

In some embodiments, the apparatus 200 and the ion beams 270 may be employed for a reactive deposition operation, as generally described with respect to FIG. 1E to 1F above. The angled ion beams 270 and may be provided in conjunction with other gaseous species in some embodiments. Gas may be provided from a gas source 224, where the gas source 224 may be a gas manifold coupled to provide a plurality of different gases to the plasma chamber 202. In particular embodiments, the angled ion beam 270 and other reactive species may be provided as a predetermined deposition recipe to the substrate 100 so as to perform a directed reactive deposition of insulator material on substrate 100, so as to form buried voids.

Figure 3:
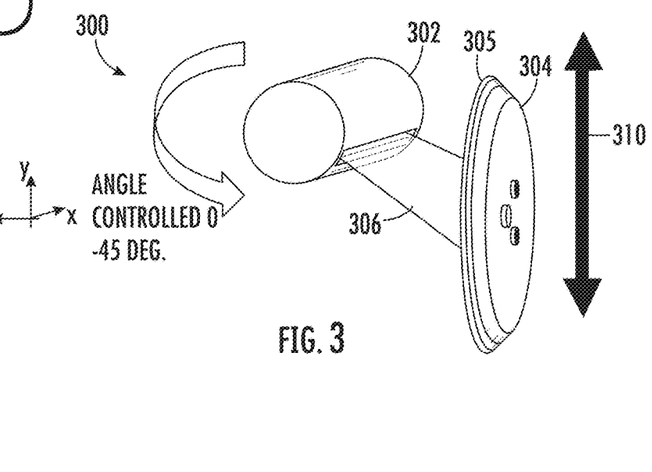
FIG. 3 illustrates another processing apparatus in accordance with other embodiments.

Referring to FIG. 3, a schematic perspective view illustrating another processing system, in accordance with further embodiments. The processing system 300 is configured as a ribbon beam plasma enhanced chemical vapor deposition system. The processing system 300 may generally include a plasma source 302 disposed adjacent a process chamber 222. The plasma source 302 is shown schematically and may be adapted to generate an energetic plasma, from a plasma chamber, shown as a cylinder. While the plasma source 302 is depicted as being generally cylindrical in shape, the present disclosure is not limited in this regard, and the plasma source 302 may be implemented in a variety of alterative shapes and configurations.

In the example shown, the plasma source 302 may be an RF inductively coupled plasma type source, used to generate a plasma therein, such as a reactive plasma suitable for plasma enhanced CVD processing (PECVD). Collimating optics (not separately shown) may be provided to generate a collimated beam that emerges from the plasma source 302. For example, the plasma source 302 may generate a combination of radicals and ions that form a beam of depositing species when impinging upon a substrate 305, disposed on a substrate holder 304. As such, the radical and ion species that form the collimated beam 306 may have a relatively narrow spread of angles of incidence. Moreover, according to various embodiments, the plasma source 302 may have a plasma chamber equipped with an elongated extraction aperture to form the collimated beam 306 as a ribbon beam, as shown in FIG. 3. The plasma source 302 may also be rotatable so as to vary the angle of incidence of the collimated beam 306, and thus vary the angle of incidence of depositing species. Suitable angles of incidence with respect to a normal to the main plane of the substrate 305 (X-Y) plane include 0 to 45 degrees in some non-limiting embodiments. To deposit a given material known combination of precursor species may be provided to the plasma source 302, such as for depositing $SiO_2$, SiN, SiCN, $\alpha$-Si, and so forth. For example, the gaseous species may include one or more of $SiH_4$, $CH_4$, $NH_3$, $O_2$, $N_2$, $SiCl_4$, $GeH_4$, Ar, $WF_6$, etc.

According to various embodiments the pressure in the ambient surrounding the substrate 305 may be sufficiently low that the depositing species in collimated beam 306 traverse from the plasma source 302 to substrate 305 in a line of sight fashion without collision. Accordingly, the angles of incidence of the depositing species of collimated beam 306 may be accurately controlled by setting the relative angle of inclination of the collimated beam 306 with respect to the substrate 305, as the collimated beam 306 emerges from the plasma source 302.

Figure 4A:
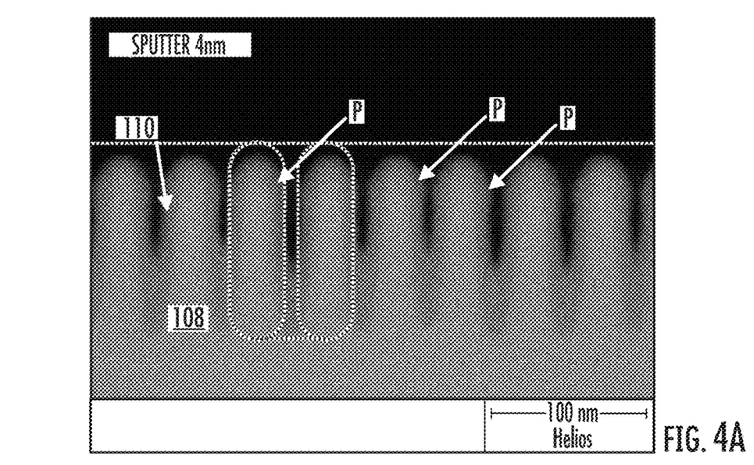
FIG. 4A and FIG. 4B illustrate alternative examples of patterned feature shaping using sputtering ions, in accordance with embodiments of the disclosure.
Figure 4B:
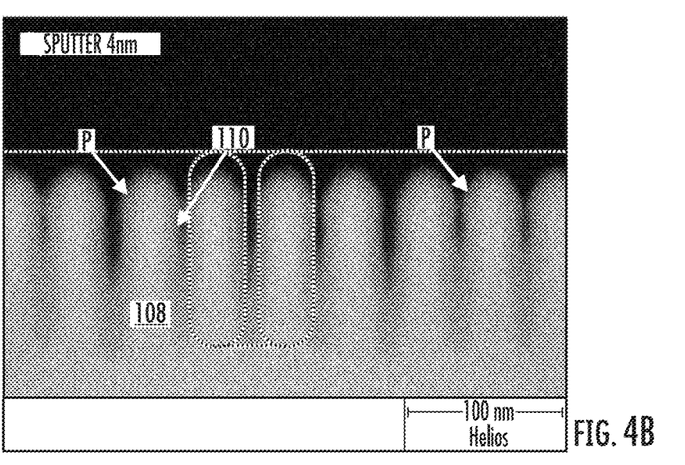

FIG. 4A and FIG. 4B (as well as the figures to follow) are electron micrographs, in this case illustrating alternative examples of patterned feature shaping using sputtering ions, in accordance with embodiments of the disclosure. In FIG. 4A, the conductive portion 108 is coated with an outer layer 110 that has been sputtered to an equivalent blanket layer thickness of 4 nm, at an angle of incidence of zero degrees with respect to normal. The net result of this sputtering of the outer layer 110 is that redistribution of material of the outer layer 110 has taken place, forming the protrusions P. In FIG. 4B, a similar structure to that structure of FIG. 4A has been subjected to similar sputter treatment, where the ion dose and ion energy is suitable to remove an equivalent blanket layer thickness of 4 nm, with a difference being that the angle of incidence of the sputtering ions is 5 degrees with respect to normal. This small change in angle of incidence arguably results in more pronounced protrusions P as shown.

Figure 5A:
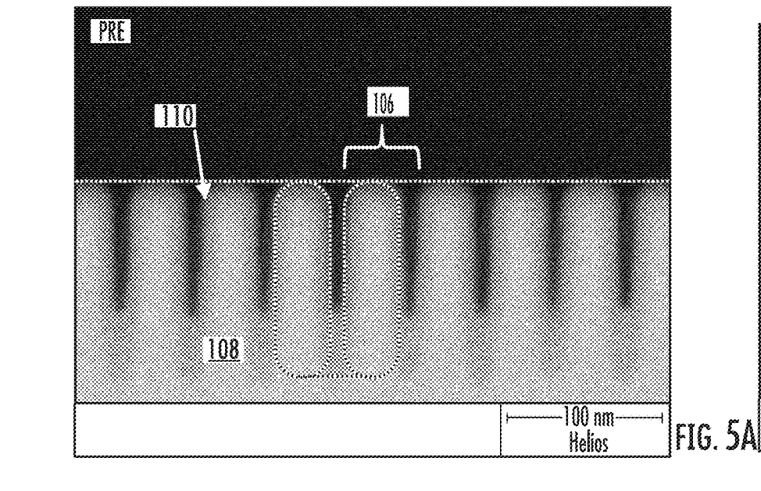
FIG. 5A illustrate an exemplary array of patterned features.
Figure 5B:
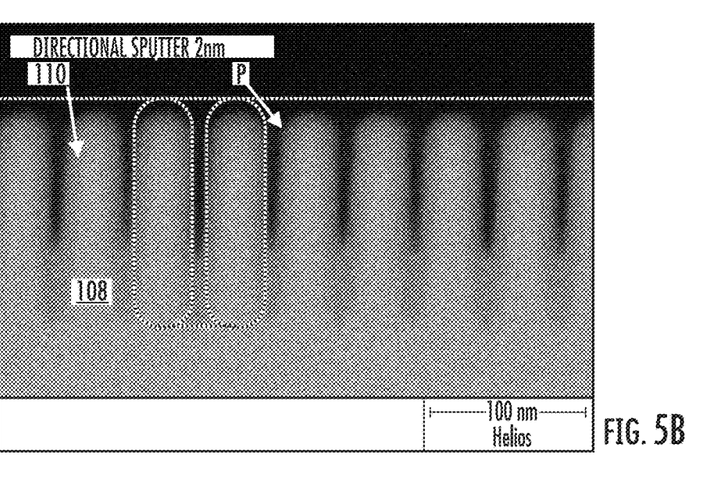
FIGS. 5B-FIG. 5D illustrate further examples of control of patterned feature shaping using sputtering ions, in accordance with embodiments of the disclosure.
Figure 5C:
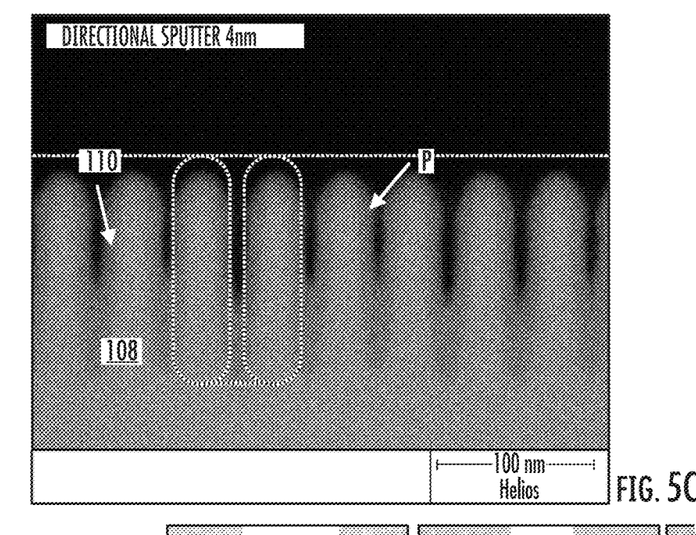
Figure 5D:
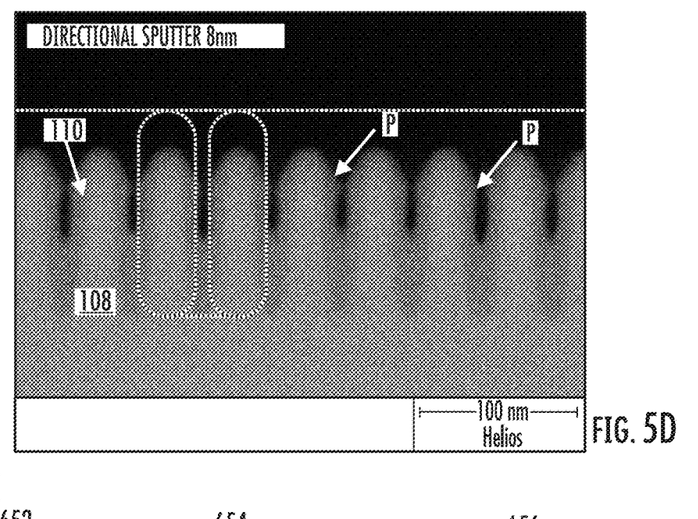
Figure 6A:
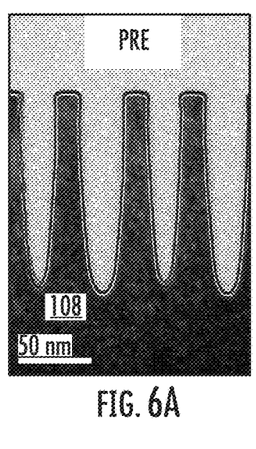
FIG. 6A illustrate another exemplary array of patterned features.
Figure 6B:
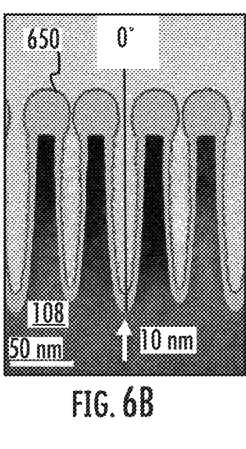
FIGS. 6B-FIG. 6E illustrate examples of control of void formation using angled depositing species, according to embodiments of the disclosure.
Figure 6C:
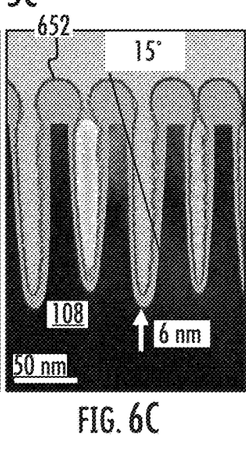
Figure 6D:
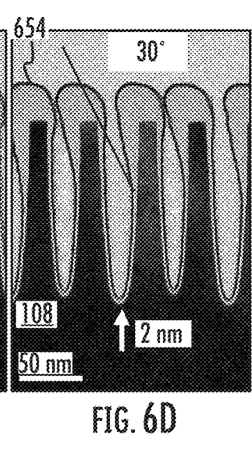
Figure 6E:
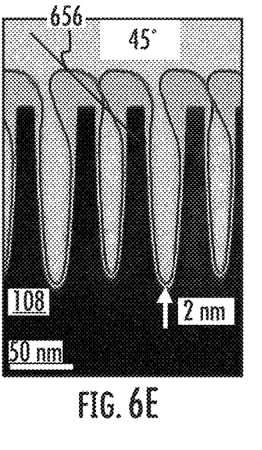

FIG. 5A illustrate an exemplary array of patterned features before shaping using ions and depositing species. As shown, the outer layer 110 is relatively uniform in thickness with no evidence of protrusions. FIGS. 5B-FIG. 5D illustrate further examples of control of patterned feature shaping using sputtering ions, in accordance with other embodiments of the disclosure. In this case, the total equivalent thickness of the outer layer that is sputtered is varied between the examples shown. In FIG. 5B, sputtering ions have been directed at the patterned features 106 at a nominal angle of 20 degrees with respect to normal (+/−10 degrees, meaning a range of angle of incidence of 10 degrees to 30 degrees) to sputter an equivalent of 2 nm banket thickness of material of the outer layer 110. With this amount of sputtering having taken place, the outer layer 110 has been reshaped with an incipient formation of protrusions P. In FIG. 5C, sputtering ions have been directed at the patterned features 106 at a nominal angle of 20 degrees to sputter an equivalent of 4 nm banket thickness of material of the outer layer 110. With this amount of sputtering having taken place, the protrusions P are more pronounced. Likewise, In FIG. 5D, sputtering ions have been directed at the patterned features 106 at an angle of 20 degrees to sputter an equivalent of 8 nm banket thickness of material of the outer layer 110. With this amount of sputtering having taken place, the protrusions P are even more pronounced FIG. 6A illustrates another exemplary array of patterned features. FIGS. 6B-FIG. 6E illustrate examples of control of void formation using angled depositing species, according to embodiments of the disclosure. In these examples, an insulator layer is deposited by a directional chemical vapor deposition process, which process may form an angled deposition beam, where the angle of incidence (shown with respect to normal to the main plane of the substrate (X-Y plane)) of depositing species can be controlled, such as detailed above with respect to FIG. 3. In FIG. 6B, the angle of incidence is zero degrees and the resultant void structures are not pinched off, while a significant amount of depositing material 650 has accumulated at the bottom surfaces between patterned features. In FIG. 6C, the angle of incidence is 15 degrees, causing less of the depositing material 652 to accumulate at the bottom surfaces, while in FIG. 6D (30 degrees) and FIG. 6E (45 degrees), none of the depositing material 654 nor depositing material 656, accumulates at the bottom of the structures, and material accumulation is increasing concentrated toward the top of the patterned features. Note that for practical purposes, in order to form buried voids, depositing species may be provided at two opposite angles of incidence (as detailed above with respect to FIGS. 2 and 3).

Thus, the illustrations in FIGS. 4A-6E provide examples of tailoring of aspects of patterned features using directional sputtering or directional deposition. In accordance with embodiments of the disclosure, a combination of directional sputtering, followed by directional deposition, may be used to generate and control void formation to form so-called air gap structure in a controlled manner.

Figure 7A:
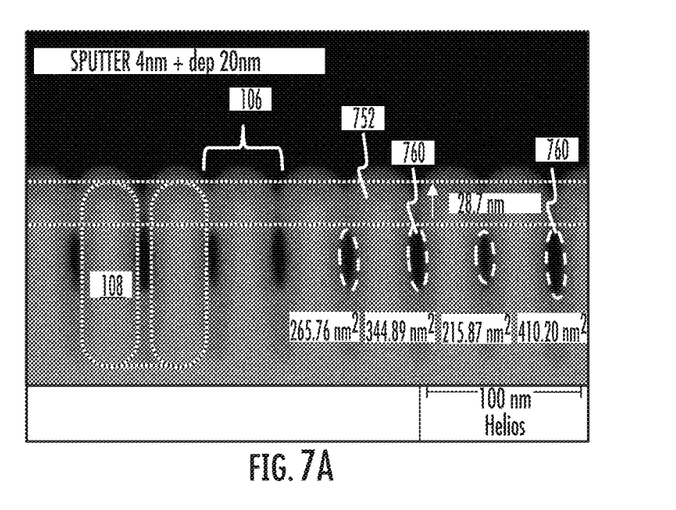
FIG. 7A and FIG. 7B illustrate control of buried void formation using a combination of sputtering ions and depositing species, shown as a function of deposition thickness, according to embodiments of the disclosure.
Figure 7B:
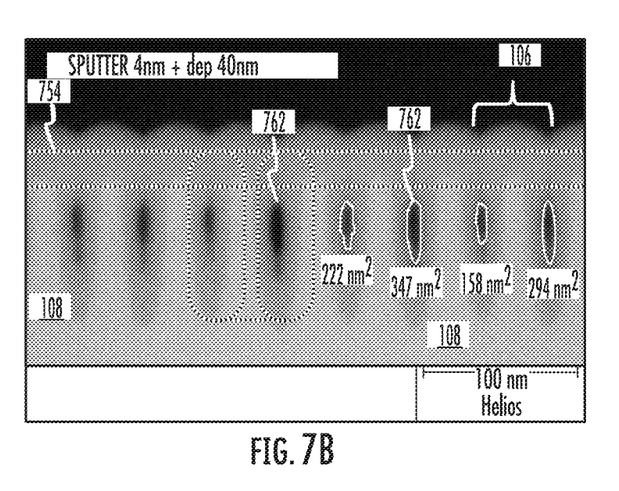

FIG. 7A and FIG. 7B illustrate control of buried void formation using a combination of sputtering ions and depositing species, shown as a function of deposition thickness, according to embodiments of the disclosure. In the example of FIG. 7A, to form the structure 752, a first exposure was conducted where sputtering ions were directed at the patterned features 106 at a nominal angle of incidence of 20 degrees, where the first exposure was effective to sputter the blanket equivalent of 4 nm of an outer layer 110. A second exposure was then performed where depositing species were directed to the patterned features to deposit an equivalent blanket thickness of 20 nm of insulator layer at an angle of +/−30 degrees, meaning ions were directed at +30 degrees and −30 degrees with respect to normal. To form the structure 754, the conditions in the example of FIG. 7B are the same as those of the example of FIG. 7A, save for the fact that the insulator layer was deposited to an equivalent thickness of 40 nm. In both cases, buried voids are formed, where the voids 760 of FIG. 7A and the voids 762 of FIG. 7B are located below the upper surface of the conductive portions 108.

Figure 7C:
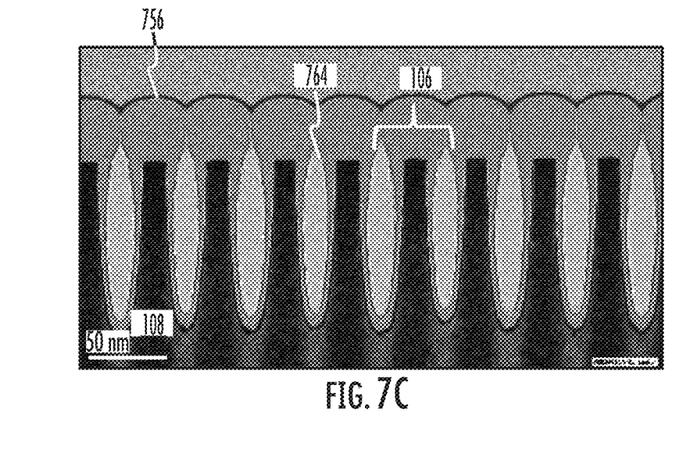
FIG. 7C illustrate an example of buried void formation using depositing species and no sputtering ions.

By way of reference, FIG. 7C illustrate an example of buried void formation using depositing species and no sputtering ions. In this example, to form the structure 756 patterned features were subjected to depositing species to generate buried voids. In the absence of the exposure to sputtering species, the buried voids 764 extend above the upper surface of the conductive portions 108. Note that in circumstances where subsequent planarization to the upper surface of the conductive portions is performed, the buried voids 764 will be exposed.

Figure 8A:
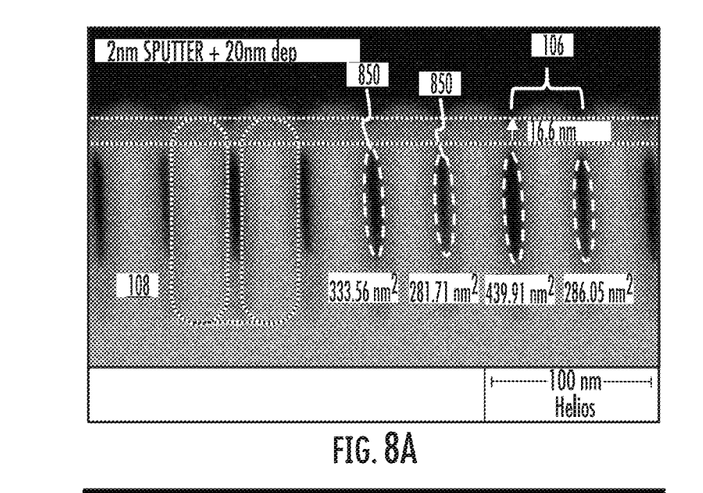
FIG. 8A to FIG. 8C illustrate control of buried void formation using a combination of sputtering ions and depositing species, shown as a function of sputtering amount, according to embodiments of the disclosure.
Figure 8B:
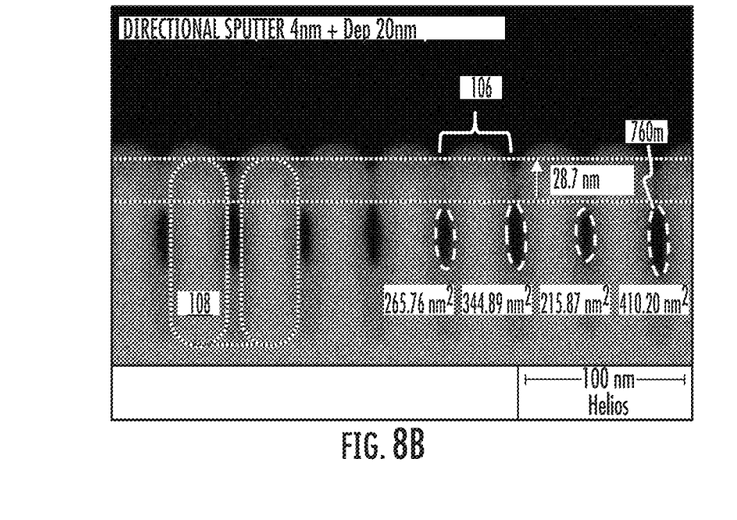
Figure 8C:
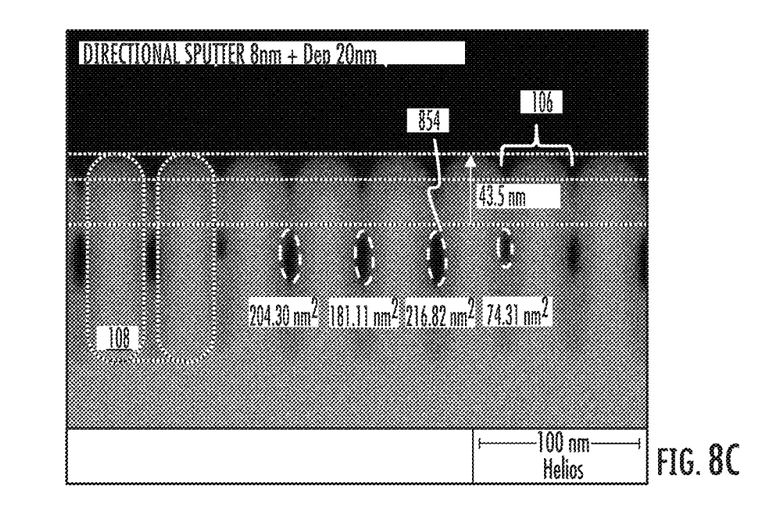

FIG. 8A to FIG. 8C illustrate control of buried void formation using a combination of sputtering ions and depositing species, shown as a function of sputtering amount, according to other embodiments of the disclosure.

In the examples of FIG. 8A to FIG. 8C, the second exposure involves providing depositing species at an angle of +/−30 degrees to deposit an equivalent blanket layer of insulator material of 20 nm. In FIG. 8A, the buried voids 850 are formed, here a first exposure was conducted where sputtering ions were directed at the patterned features 106 at nominal angle of incidence of 20 degrees, where the first exposure was effective to sputter the blanket equivalent of 2 nm of an outer layer 110. A second exposure was then performed where depositing species were directed to the patterned features to deposit an equivalent blanket thickness of 20 nm of insulator layer at an angle of +/−30 degrees. The example of FIG. 8B are the same as those of the example of FIG. 7A, where the equivalent of 4 nm is sputtered an angle of incidence of 20 degrees, in the first exposure. The example of FIG. 8C, in order to form the buried voids 854, employs a first exposure where the equivalent of 8 nm is sputtered at a nominal angle of incidence of 20 degrees. As evident, at least in the range of 2 nm to 8 nm, increasing the amount of sputtering in the first exposure leads to placement of the top of the buried voids at increasing distance below the top of the conductive portions 108.

In summary, the above examples illustrate the ability to control placement of buried voids within an array of patterned features using a combination of directional sputtering and directional deposition. According to other embodiments, directional sputtering may be used in conjunction with known, non-directional, non-angled CVD processing, with the ability to form buried voids. Such approach may offer less control of placement of the buried voids. However, by virtue of the formation of protrusions in patterned features after the first exposure to directional sputtering species, non-directional CVD can be expected to generate buried voids that are located below the upper surface of the patterned features.

Figure 9:
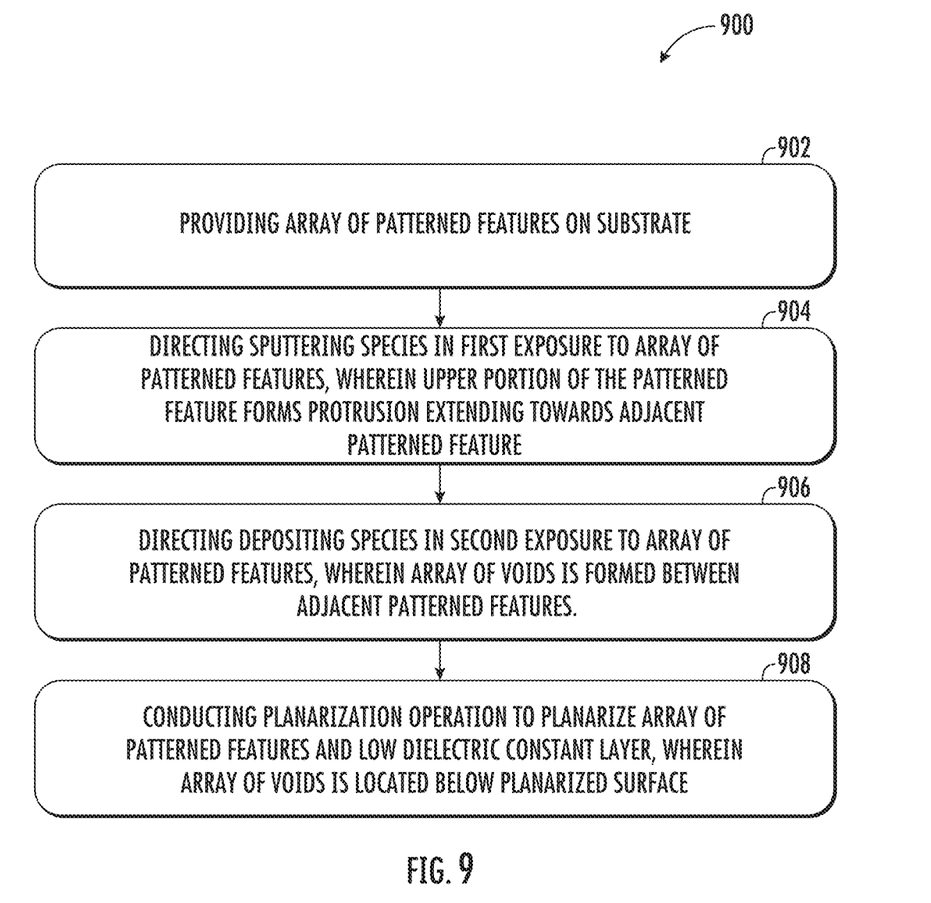
FIG. 9 is a flow diagram illustrating a method in accordance with an exemplary embodiment of the present disclosure.

FIG. 9 is a flow diagram illustrating a process flow 900 in accordance with an exemplary embodiment of the present disclosure. At block 902, an array of patterned features is provided on a substrate. The patterned features may be unitary structures, such as patterned insulator structures, patterned semiconductor structures, or patterned metal structures. According to some embodiments, a given patterned feature of the array of patterned features includes a conductive portion, and an outer layer, comprising an insulator material, disposed over the conductive portion. The conductive portion may be a metal structure, such as a wiring structure or other conductor. The outer layer may be any suitable insulator. According to some embodiments, the thickness of the outer layer may be a predetermined amount in order to protect the conductive portion from exposure during subsequent sputtering operations.

At block 904, sputtering species are directed in a first exposure to the array of patterned features. As such, the upper portion of the patterned feature may form a protrusion extending towards adjacent patterned features after the first exposure. The sputtering species may include any ions that are suitable for sputtering material of the outer layer, including inert gas ions, oxygen ions, nitrogen ions, and so forth. In some non-limiting embodiments, the energy of the sputtering species may range from approximately 50 eV to 10 keV. The first exposure may be set so as to sputter a targeted amount of material so as to cause redistribution of material in the patterned features, resulting in formation of the protrusions.

In embodiments where the patterned features include a conductive portion and an outer layer, the first exposure may be set so as to sputter a targeted amount of material of the outer layer, and in particular, so as not to expose the conductive portion. Said differently, at least a residual amount of the outer layer may remain over the outer surface of the conductive portion after the first exposure, including on the upper surface and sidewalls of the conductive portion. The angle of incidence of the sputtering species may be set to form a non-zero angle with respect to a normal to a main plane of the substrate. The particular non-zero angle may be adjusted to tailor the shape and the extent of the protrusion.

At block 906, depositing species are directed in a second exposure to the array of patterned features, after the first exposure, wherein an array of voids is formed between adjacent patterned features of the array of patterned features. The depositing species may be a suitable insulator material, configured to form a low dielectric constant layer, above and between patterned features of the array of patterned features. In some embodiments, the depositing species may be directed in a non-directional CVD process, where depositing species may impinge upon the array of patterned features over a wide range of angles. In some embodiments the depositing species may be provided in a directional CVD process to the array of patterned features. In some embodiments, the directional CVD process may be an angled deposition process where the depositing species are directed as a collimated reactive beam to the substrate, forming a non-zero angle of incidence with respect to a normal to a main substrate plane. The angle of incidence of the depositing species may be tailored to adjust placement of the array of voids. In particular, the combination of the conditions for the first exposure for sputtering material of the patterned features, and the conditions for the second exposure for depositing species may be tailored to place the array of voids below a level of an upper surface of the array of patterned features. Said differently, the top of the voids of the array of voids may be below the upper surface of the conductive portions.

At block 908, a planarization operation is conducted to planarize the array of patterned features and the low dielectric constant layer. As such, the array of voids may be located below the planarized surface, and thus may constitute buried voids.

In sum, the present approach provides various advantages. One advantage is realized in that, by generating a protrusion using a directional sputtering process, the position of a void or air-gap to be formed can be controlled. Another advantage is provided by embodiments that limit the top of voids to below the top of patterned features. In this manner, the present approach also ensures that any subsequent planarization process that planarizes to the top of the patterned features, such as a chemical mechanical polishing operation (CMP), does not introduce foreign material such as slurry into the voids.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize its usefulness is not limited thereto. Embodiments of the present disclosure may be beneficially implemented in any number of environments for any number of purposes. Accordingly, the claims set forth below shall be construed in view of the full breadth and spirit of the present disclosure as described herein.

The invention claimed is:

1. A method, comprising:
 providing an array of patterned features on a substrate;
 directing a sputtering species in a first exposure to the array of patterned features, wherein an upper portion of a patterned feature of the array of patterned features forms a protrusion, extending towards an adjacent patterned feature, of the array of patterned features; and
 directing a depositing species in a second exposure to the array of patterned features, wherein an array of voids is formed between adjacent patterned features,
 wherein a patterned feature of the array of patterned features comprises a conductive portion, and an outer layer, comprising an insulator material, disposed over an outer surface of the conductive portion,
 wherein the outer layer comprises an initial thickness before the first exposure, wherein an ion dose and ion energy of the sputtering species of the first exposure is effective to remove a targeted thickness of the outer layer, wherein the targeted thickness is less than the initial thickness.

2. The method of claim 1, wherein the sputtering species is directed at an angle of incidence of 0 degrees to 45 degrees with respect to a normal to a main surface of the substrate.

3. The method of claim 1, wherein an uppermost point of the array of voids is disposed below a level of an upper surface of the array of patterned features.

4. The method of claim 1, the directing the depositing species comprises performing a chemical vapor deposition process.

5. The method of claim 4, wherein the directing the depositing species comprises performing a directional chemical vapor deposition process using an angled deposition beam.

6. The method of claim 5, the angled deposition beam having an angle of incidence of 5 degrees to 60 degrees with respect to a normal to a main plane of the substrate.

7. A method, comprising:
providing an array of patterned features on a substrate, the array of patterned features comprising a conductive portion, and an outer layer, comprising an insulator material, disposed over an outer surface of the conductive portion;
directing a sputtering species in a first exposure to the array of patterned features, wherein an upper portion of the outer layer forms a protrusion, extending towards an adjacent patterned feature, of the array of patterned features; and
directing a depositing species in a second exposure to the array of patterned features, wherein an array of voids is formed between adjacent patterned features,
wherein the outer layer comprises an initial thickness before the first exposure, wherein an ion dose and ion energy of the sputtering species of the first exposure is effective to remove a targeted thickness of the outer layer, wherein the targeted thickness is less than the initial thickness.

8. The method of claim 7, wherein the sputtering species is directed at an angle of incidence of 0 degrees to 45 degrees with respect to a normal to a main surface of the substrate.

9. The method of claim 7, wherein an uppermost point of the array of voids is disposed below a level of an upper surface of the array of patterned features.

10. The method of claim 7, the directing the depositing species comprises performing a chemical vapor deposition process.

11. The method of claim 10, wherein the directing the depositing species comprises performing a directional chemical vapor deposition process using an angled deposition beam.

12. The method of claim 11, the angled deposition beam has an angle of incidence of 5 degrees to 60 degrees with respect to a normal to a main plane of the substrate.

13. A method of forming an airgap device structure, comprising:
providing an array of patterned features on a substrate, the array of patterned features, comprising a conductive portion, and an outer layer, comprising an insulator material, disposed over an outer surface of the conductive portion;
directing a sputtering species in a first exposure to the array of patterned features, wherein an upper portion of the outer layer forms a protrusion, extending towards an adjacent patterned feature, of the array of patterned features, and wherein the sputtering species do not strike a bottom surface of the array of patterned features; and
directing a depositing species in a second exposure to the array of patterned features, the second exposure comprising a directional plasma enhanced chemical vapor deposition process, wherein an array of voids is formed between adjacent patterned features, wherein the outer layer comprises an initial thickness before the first exposure, wherein an ion dose and ion energy of the sputtering species of the first exposure is effective to remove a targeted thickness of the outer layer, wherein the targeted thickness is less than the initial thickness.

14. The method of claim 13, wherein the first exposure and the second exposure are performed in a common apparatus.

15. The method of claim 13, wherein the depositing species form an SiO-based material.

16. The method of claim 13, wherein an uppermost point of the array of voids is disposed below a level of an upper surface of the array of patterned features.

* * * * *